(12) United States Patent
Zhou et al.

(10) Patent No.: US 12,300,570 B2
(45) Date of Patent: May 13, 2025

(54) GRINDABLE HEAT SINK FOR MULTIPLE DIE PACKAGING

(71) Applicant: Micron Technology, Inc., Boise, ID (US)

(72) Inventors: Wei Zhou, Boise, ID (US); Bret K. Street, Meridian, ID (US); Kyle K. Kirby, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 502 days.

(21) Appl. No.: 17/583,038

(22) Filed: Jan. 24, 2022

(65) Prior Publication Data

US 2023/0238300 A1 Jul. 27, 2023

(51) Int. Cl.
| | |
|---|---|
| *H01L 23/373* | (2006.01) |
| *H01L 21/56* | (2006.01) |
| *H01L 21/603* | (2006.01) |
| *H01L 23/31* | (2006.01) |
| *H01L 23/544* | (2006.01) |
| *H01L 25/16* | (2023.01) |

(52) U.S. Cl.
CPC ........ *H01L 23/3736* (2013.01); *H01L 21/561* (2013.01); *H01L 21/568* (2013.01); *H01L 21/603* (2021.08); *H01L 23/3107* (2013.01); *H01L 23/544* (2013.01); *H01L 25/16* (2013.01)

(58) Field of Classification Search
None
See application file for complete search history.

(56) References Cited

U.S. PATENT DOCUMENTS

| | | | |
|---|---|---|---|
| 2015/0069596 A1* | 3/2015 | Kawasaki | H01L 21/4817 438/122 |
| 2021/0398872 A1* | 12/2021 | Huang | H01L 23/367 |

* cited by examiner

*Primary Examiner* — Jay C Chang
(74) *Attorney, Agent, or Firm* — Perkins Coie LLP

(57) ABSTRACT

A semiconductor package can include a semiconductor die stack including a top die and one or more core dies below the top die. The semiconductor package can further include a metal heat sink plated on a top surface of the top die and have a plurality of side surfaces coplanar with corresponding ones of a plurality of sidewalls of the semiconductor die stack. A molding can surround the stack of semiconductor dies and the metal heat sink, the molding including a top surface coplanar with an exposed upper surface of the metal heat sink. The top surface of the molding and the exposed upper surface of the metal heat sink are both mechanically altered. For example, the metal heat sink and the molding can be simultaneously ground with a grinding disc and can show grinding marks as a result.

20 Claims, 8 Drawing Sheets

GRINDABLE HEAT SINK FOR MULTIPLE DIE PACKAGING

TECHNICAL FIELD

The present disclosure generally relates to semiconductor device packaging, in particular semiconductor device packaging with grindable heat sinks.

BACKGROUND

Semiconductor device manufacturers continually seek to make smaller, faster, and more powerful devices with a higher density of components for a wide variety of products, such as computers, cell phones, watches, cameras, and more. One approach for increasing the speed and power of a semiconductor device without substantially increasing the device's footprint is to vertically stack multiple semiconductors dies on top of one another in a single package. However, increased power causes devices to generate more heat. The issue of heat is further magnified due to the higher density and reduced surface area of stacked dies.

BRIEF DESCRIPTION OF THE DRAWINGS

Many aspects of the present technology can be better understood with reference to the following drawings. The components in the drawings are not necessarily to scale. Instead, emphasis is placed on clearly illustrating the principles of the present technology.

DETAILED DESCRIPTION

Figure 1:
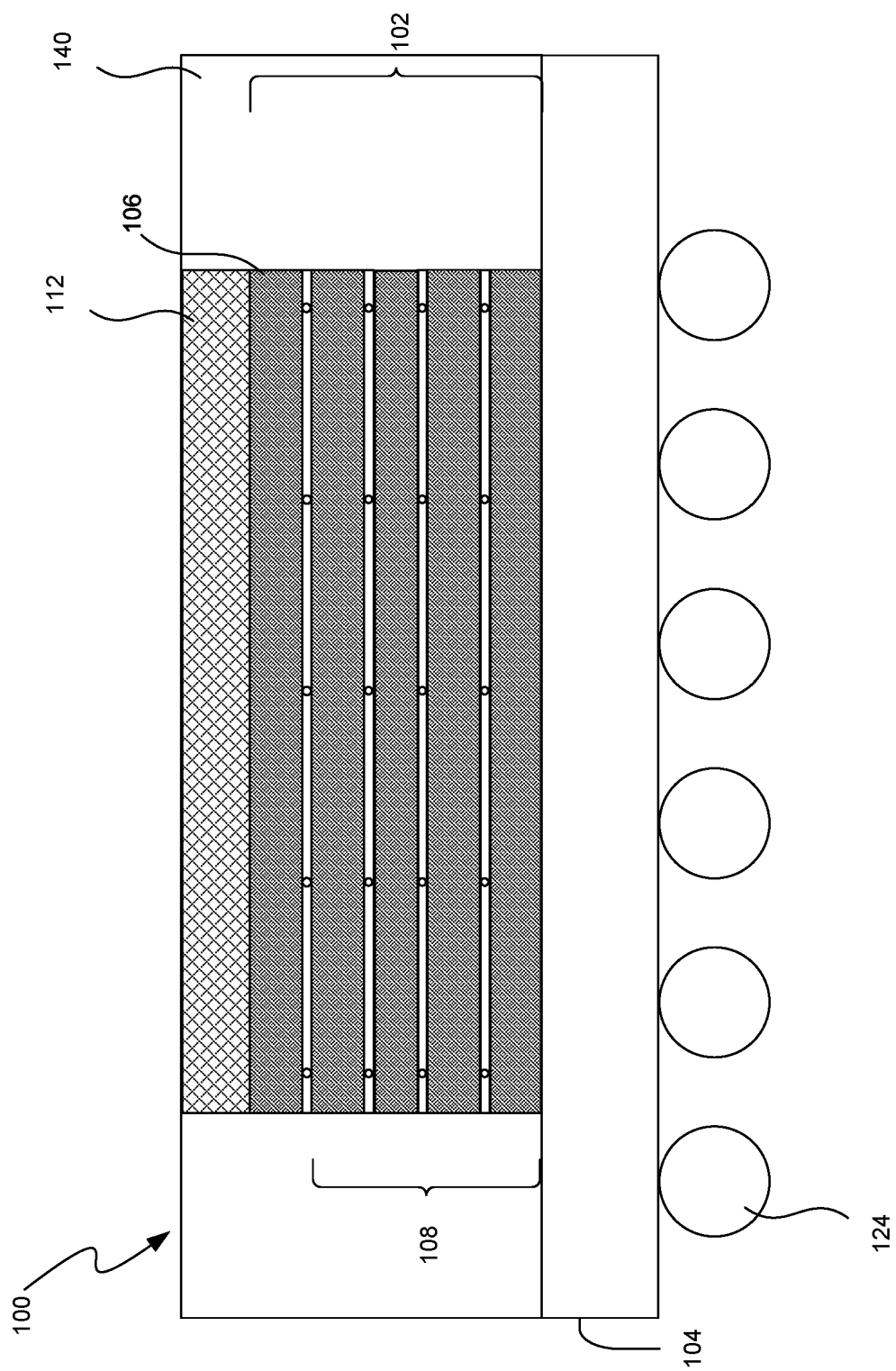
FIG. 1 is a cross-sectional view of a semiconductor device package in accordance with embodiments of the present disclosure.

In this disclosure, numerous specific details are discussed to provide a thorough and enabling description for embodiments of the present disclosure. One of ordinary skill in the art will recognize that the disclosure can be practiced without one or more of the specific details. Well-known structures and/or operations often associated with semiconductor devices may not be shown and/or may not be described in detail to avoid obscuring other aspects of the disclosure. In general, it should be understood that various other devices, systems, and/or methods in addition to those specific embodiments disclosed herein may be within the scope of the present disclosure.

The term "semiconductor device" generally refers to a solid-state device that includes semiconductor material. A semiconductor device can include, for example, a semiconductor substrate, wafer, panel, or a single die from a wafer or substrate. A semiconductor device may further include one or more device layers deposited on a substrate.

The term "semiconductor device package" can refer to an arrangement with one or more semiconductor devices incorporated into a common package. A semiconductor package can include a housing, molding, or casing that partially or completely encapsulates at least one semiconductor device. A semiconductor package can also include a substrate that carries one or more semiconductor devices. The substrate may be attached to or otherwise incorporated within the housing or casing.

The term "semiconductor device assembly" can refer to an assembly of one or more semiconductor devices, semiconductor device packages, and/or substrates, which may include interposers, supports, and/or other suitable substrates. The semiconductor device assembly may be manufactured as, but not limited to, discrete package form, strip or matrix form, and/or wafer panel form.

As manufacturers continue to increase the number of dies in 3D integrated circuits and packaging, overheating of multiple die stacks becomes a greater issue. Temperature fluctuations within these stacks can cause the components and interconnects to deform, degrading performance and ultimately causing the devices to fail. In addition, customers who purchase devices with multiple die stacks for use in their products often need to perform post-mold grinding, for example to produce thinner phones, laptops, and watches. Conventional heat sinks are attached to the top die using a thermal interface material, such as thermal paste or thermal adhesive. However, these thermal interface materials cannot withstand the forces of grinding process. This may require a customer to thin the device and apply a separate heat sink, which increases the number of steps and overall cost.

To address these issues, embodiments of the present disclosure provide a semiconductor device package including a grindable heat sink plated on the top die of a stack of semiconductor dies. Plating the heat sink removes the need to use thermal interface material. The stack of semiconductor devices and the grindable heat sink can be embedded in a molding. The molding provides additional support for the heat sink and allows customers to simultaneously grind the molding and the heat sink as needed, thinning the package without grinding the top die or needing a separate heat sink. To fabricate these packages, the top die can be mounted on a dummy carrier, thinned, and plated with the grindable heat sink material. This can be a wafer-level process such that a semiconductor wafer is plated with the heat sink material before debonding from the carrier and dicing into individual plated dies. The plated top die can then be mounted on a stack of semiconductor dies, encapsulated by the molding, and ground to expose the heat sink.

FIG. 1 is a cross-sectional view of a semiconductor device package 100 in accordance with embodiments of the present disclosure. The package 100 includes a stack of semiconductor dies 102 mounted on a substrate 104. The package 100 further includes a molding 140 surrounding the stack of semiconductor dies 102. The stack of semiconductor dies 102 can include a top die 106 plated with a metal heat sink 112. The metal heat sink can be copper, aluminum, or other suitable heat sink material. As shown, the top surface of the heat sink 112 and a top surface of the molding 140 can be coplanar as a result of grinding the molding 140 and the heat sink 112. For example, the molding 140 and heat sink 112 can be ground with a grinding wheel or disc. As a result, the heat sink 112 can exhibit grinding marks the grinding. The heat sink 112 and the molding 140 can be further ground, for example by a customer who uses the semiconductor device package 100 in a larger system.

The top die 106 can be prefabricated with the metal heat sink 112, then mounted on the core dies 108 by any suitable process. For example, the top die 106 can be thermocompression bonded (TCB) to the core die 108a. A die attach film, such as nonconductive film or CV film, can be used as a spacer between the dies of the stack 102. The top die 106 can be fabricated with the metal heat sink 112 by plating a metal layer on a semiconductor wafer. In some embodiments, a seed layer is deposited on the wafer before plating, such as by physical vapor deposition (PVD). The seed layer can be, for example, a thin layer of copper or titanium. The seed layer can be approximately 1 μm thick. The fabrication process is described in more detail with reference to FIG. 2A-E below.

The stack of semiconductor dies 102 can include the top die 106 and one or more core dies 108. For example, the core dies 108 can be memory dies, such as DRAM dies of a high bandwidth memory (HBM) device. In addition, the core dies 108 can be other types of memory, such as SRAM, SDRAM, or flash memory, or non-memory devices. The core dies 108 can be approximately the same thickness as the top die 106. For example, the core dies 108 and the top die 106 can each be about 50 μm thick. Although FIG. 1 shows a total of five dies including top die 106, and core dies 108, embodiments of the present invention can include more dies, such as 8, 12, 16 or more. In some embodiments, the stack 102 can have as few as a one die, i.e., only a top die 106. Furthermore, in some embodiments, dies of the stack 102 can be of the same size, as shown in FIG. 1, or of different sizes. The dies of stack 102 can have different stacking arrangements, such as pyramid stacking, overhang die stacking, etc.

The stack of semiconductor dies 102 can be interconnected using through silicon vias (TSVs) and bumps. In some embodiments, the dies of the stack 102 can be connected using bond wires instead of or in addition to TSVs. For example, spacers between the dies can provide the room needed to attach bond wires to the dies. The bond wires can then be coupled to pads on the package substrate 104 (not shown).

The package substrate 104 can be or include an interposer, a printed circuit board, a dielectric spacer, another semiconductor die (e.g., a logic die), or another suitable substrate. The package substrate 104 can include pads electrically coupled to the semiconductor die stack 102. In some embodiments, the package substrate 104 includes additional semiconductor components (e.g., doped silicon wafers or gallium arsenide wafers), nonconductive components (e.g., various ceramic substrates, such as aluminum oxide ($Al_2O_3$), etc.), aluminum nitride, and/or conductive portions (e.g., interconnecting circuitry, TSVs, etc.). The package substrate 104 can further include electrical connectors 124 (e.g., solder balls, conductive bumps, conductive pillars, conductive epoxies, and/or other suitable electrically conductive elements) electrically coupled to the package substrate 104 and configured to electrically couple the package 100 to an external device (not shown). Optionally, the package substrate 104 can include one or more signal routing structures or layers (not shown) including electrically conductive components such as traces, vias, etc., that transmit signals between the electrical connectors 124 and the semiconductor die stack 102.

Figure 2A:
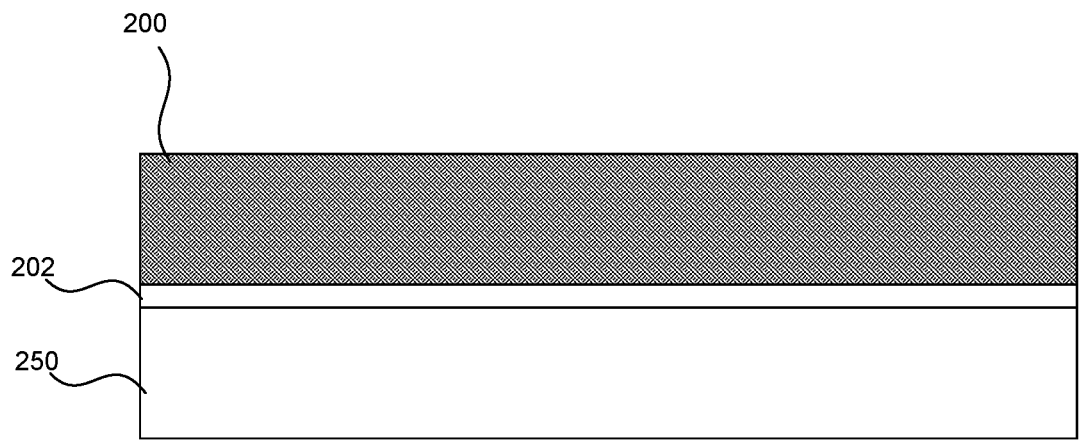
FIG. 2A is a cross-sectional view of a semiconductor wafer mounted on a carrier in accordance with embodiments of the present disclosure.

FIGS. 2A-G illustrate a semiconductor device assembly at various stages during a fabrication process. FIG. 2A is a cross-sectional view of a semiconductor wafer 200 mounted on a carrier 250 in accordance with embodiments of the present disclosure. The semiconductor wafer 200 can be mounted on the carrier 250 using standard mounting processes. For example, the wafer 200 can be mounted to the carrier using a temporary mounting adhesive 202. The carrier 250 can be made of glass or other suitable material.

Figure 2B:
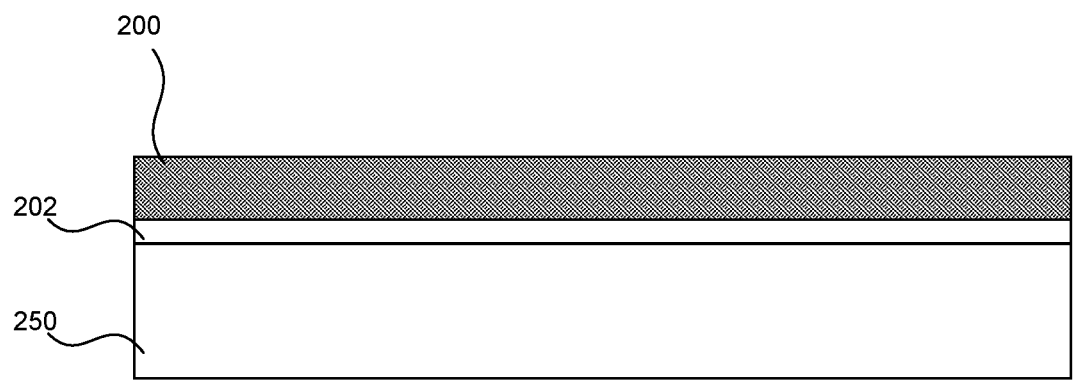
FIG. 2B is a cross-sectional view of a semiconductor wafer mounted on a carrier after thinning in accordance with embodiments of the present disclosure.

FIG. 2B is a cross-sectional view of the semiconductor wafer 200 of FIG. 2A mounted on a carrier after thinning in accordance with embodiments of the present disclosure. The semiconductor wafer can be thinned by backgrinding the wafer 200, such as with a grinding wheel. The semiconductor wafer 200 can be thinned to approximately 50 μm thickness.

Figure 2C:
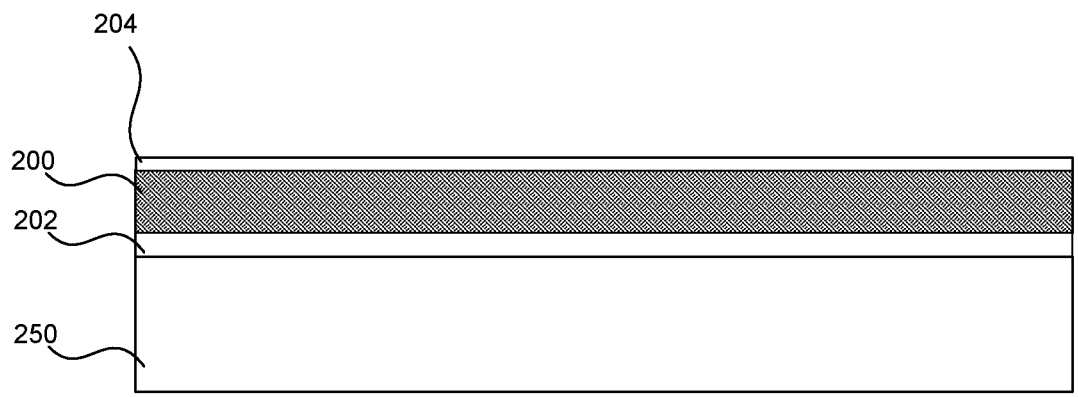
FIG. 2C is a cross-sectional view of a semiconductor wafer with a seed layer in accordance with embodiments of the present disclosure.

FIG. 2C is a cross-sectional view of a semiconductor wafer 200 with a seed layer 204 in accordance with embodiments of the present disclosure. The seed layer 204 can be deposited on the backside of the semiconductor wafer 200 by PVD methods, such as sputtering or evaporation deposition. The seed layer can comprise a metal such as copper or titanium and facilitate electroplating a metal layer on the semiconductor wafer 200, shown below in FIG. 2D. In some embodiments, the backside of the semiconductor wafer 200 is passivated prior to depositing the seed layer 204. Passivation can remove contamination on the surface of the semiconductor wafer 200 and improve adhesion of the plated metal layer. The semiconductor wafer 200 can be passivated, for example, by forming a passivation layer of silicon nitride or silicon oxide via chemical vapor deposition (CVD). The passivation layer and the seed layer 204 combined can be less than 1 μm thick.

Figure 2D:
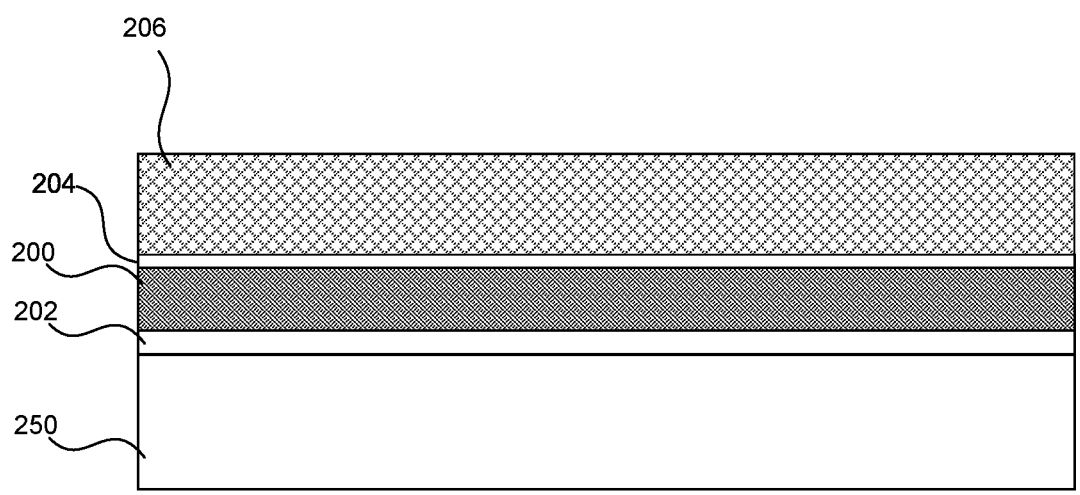
FIG. 2D is a cross-sectional view of a semiconductor wafer with a plated metal layer in accordance with embodiments of the present disclosure.

FIG. 2D is a cross-sectional view of a semiconductor wafer 200 with a plated metal layer 206 in accordance with embodiments of the present disclosure. The plating of the plated metal layer 206 can be facilitated by the seed layer 204 of FIG. 2C. The plated metal layer 206 can comprise metal suitable for a heat sink, such as copper or aluminum. The metal layer 206 can have a thickness between approximately 50 and 250 μm, 100 and 200 μm, 125 and 175 μm, etc. For example, the metal layer 206 can be approximately 135 μm thick. The plated metal layer 206 can be similar to the metal heat sink 112 of FIG. 1, except it is plated on the semiconductor wafer 200 rather than an individual die. After the metal layer 206 is plated, the semiconductor wafer 200 can be debonded from carrier 250.

Figure 2E:
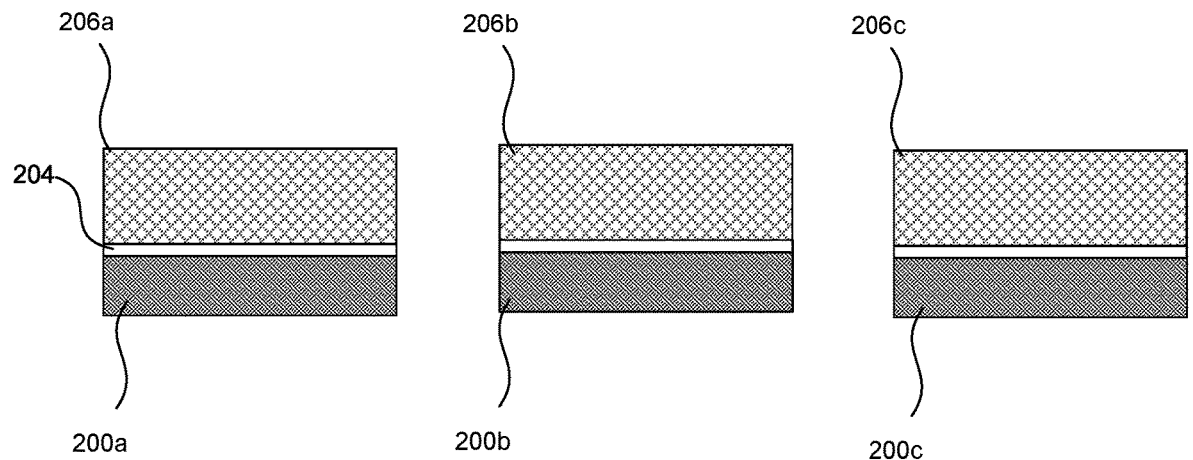
FIG. 2E is a cross-sectional view of a plurality of semiconductor dies with plated metal layers in accordance with embodiments of the present disclosure.

FIG. 2E is a cross-sectional view of a plurality of semiconductor dies 200a-c with plated metal layers 206a-c in accordance with embodiments of the present disclosure.

After debonding from the carrier 250 of FIGS. 2A-D, the semiconductor wafer 200 with metal layer 206 of FIGS. 2A-D can be diced to form a plurality of semiconductor dies including semiconductor dies 200a-c plated with metal layers 206a-c, respectively. The semiconductor wafer 200 and metal layer 206 can be diced with a dicing saw along one or more saw streets. Other suitable dicing methods known in the art can be used, provided they can dice the metal layer 206 in addition to the wafer 200. Depending on the singulation method, the metal layers 206a-c or the semiconductor dies 200a-c can exhibit evidence of the singulation along their sidewalls. For example, the sidewalls of the metal layers 206a-c or sidewalls of the semiconductor dies 200a-c can exhibit markings associated with mechanical alteration, such as saw marks from dicing with a saw or blade. In some embodiments, the saw streets can be arranged in a rectilinear pattern.

Figure 2F:
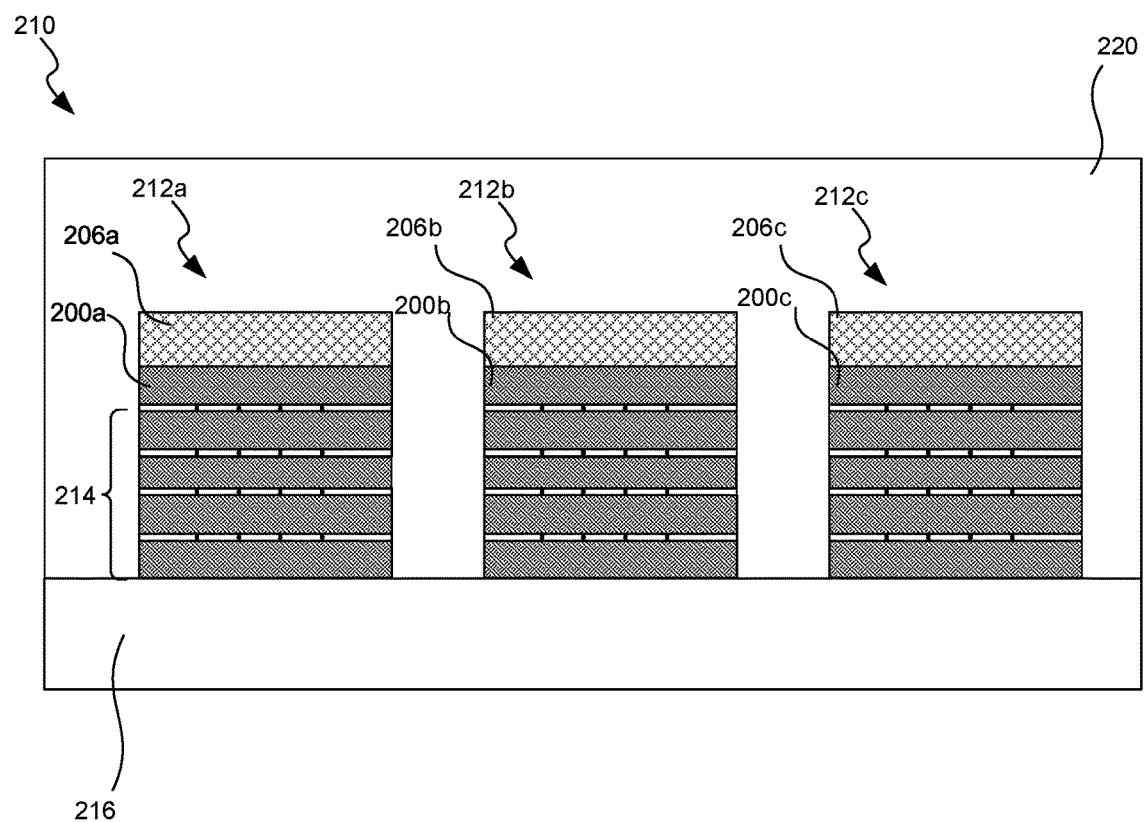
FIG. 2F is a cross-sectional view of an intermediate semiconductor structure including a plurality of semiconductor die stacks in accordance with embodiments of the present disclosure.

FIG. 2F is a cross-sectional view of an intermediate semiconductor structure 210 including a plurality of semiconductor die stacks 212a-c in accordance with embodiments of the present disclosure. FIG. 2F only shows three semiconductor die stacks 212a-c for illustration, but the intermediate semiconductor structure 210 can include a greater number of die stacks depending on the size of the die. For example, a wafer can be a 300 mm diameter circle, and a die can be a 10×10 mm square. The semiconductor die stacks 212a-c can also include a greater number of dies in each stack, such as eight, 12, or 16 dies.

The semiconductor die stacks 212a-c can each include a top die with a metal layer, similar to semiconductor die stack 102 of FIG. 1. Each semiconductor die stack 212a-c can be formed by mounting one of the semiconductor dies 200a-c from FIG. 2E onto a stack of core dies 214. The semiconductor dies 200a-c thus function as top dies of the semiconductor die stacks 212a-c, similar to top die 106 of FIG. 1. The semiconductor dies 200a-c can be mounted by thermocompression bonding (TCB), which applies heat to bond bumped dies. TCB can generally be a slow process, and the metal layers 206a-c on the backside of the semiconductor dies 200a-c can improve transfer of the applied heat, enhancing the TCB process compared to conventional dies. A die attach film, such as NCF can be laminated on the dies prior to TCB. Or a capillary underfill (CUF) can be applied to fill the gaps between die stacks post TCB.

The core dies 214 can be mounted on top of one another using a similar process to mounting the top semiconductor die 200a, e.g., TCB with laminated die attach film. The core dies 214 can be electrically interconnected by TSVs, which require less space between the dies compared to bond wires. However, bond wires can also be used. The core dies 214 can be memory dies, such as DRAM.

The semiconductor dies stacks 212a-c can be mounted on an interface (IF) wafer 216. For example, the core dies 214 can be mounted on the IF wafer 216 by TCB. The IF wafer 216 can include a plurality of dies. For example, the IF wafer 216 can include a plurality of logic dies, such as memory controllers or GPUs. In some embodiments, the IF wafer 216 can include dies similar to core dies 214. For example, the core dies 214 and the IF wafer 216 can both comprise memory dies. The IF wafer 216 can include electrical connections such as circuitry or TSVs, For example, the IF wafer can include TSVs which can be exposed after backside thinning.

After stacking the semiconductor dies 200a-c on the core dies 214, the semiconductor die stacks 212a-c and the metal layers 206a-c can be at least partially surrounded by a molding 220. For example, the molding 220 can encapsulate these components. The molding 220 can be any suitable mold compound used in semiconductor packaging, such as epoxy resin, and formed by injection molding, transfer molding, or compression molding.

Figure 2G:
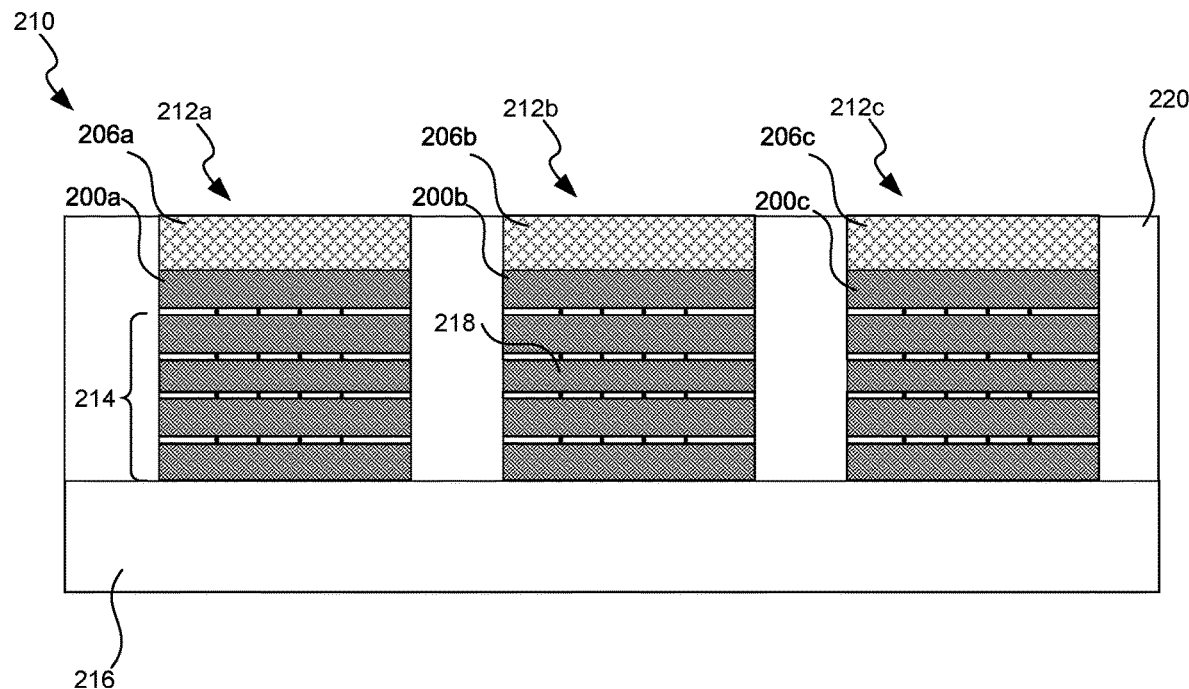
FIG. 2G is a cross-sectional view of an intermediate semiconductor structure including a plurality of semiconductor die stacks after grinding in accordance with embodiments of the present disclosure.

FIG. 2G is a cross-sectional view of the intermediate semiconductor structure 210 including the plurality of semiconductor die stacks 212a-c after grinding in accordance with embodiments of the present disclosure. The intermediate semiconductor structure 210 can be ground by an abrasive grinding wheel or disc. As a result, the metal layers 206a-c can exhibit evidence of mechanical alteration indicative of abrasion from the grinding wheel or disc. For example, such evidence of mechanical alteration can include swirls, grooves, or other marks. The molding 220 can be ground until the metal layers 206a-c are exposed and flush with the molding. This produces devices with embedded heat sinks that can withstand further grinding by users who desire thinner devices. After grinding and exposing the metal layers 206a-c, the intermediate semiconductor structure 210 can be attached to a carrier, and the IF wafer 216 can be thinned.

Figure 2H:
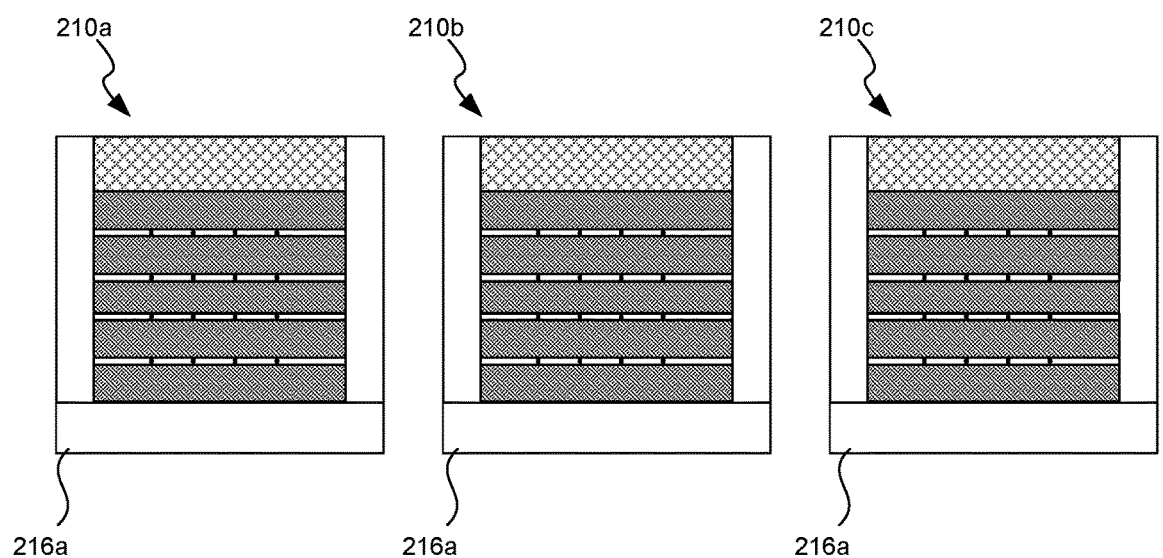
FIG. 2H is a cross-sectional view of a plurality of singulated semiconductor die packages in accordance with embodiments of the present disclosure.

FIG. 2H is a cross-sectional view of a plurality of singulated semiconductor device packages 210a-c in accordance with embodiments of the present disclosure. The intermediate semiconductor structure 210 of FIG. 2G can be singulated into semiconductor device packages 210a-c by a dicing saw or other suitable dicing mechanism. Each of the singulated semiconductor device packages 210a-c can be similar to semiconductor device package 100 of FIG. 1. As shown, the IF wafer 216 shown in FIG. 2G can be singulated into individual dies 216a-c. In addition, the intermediate semiconductor structure 210 of FIG. 2G can be subjected to additional processing as a part of the dicing process, such as backside grinding. For example, the dies 216a-c can be thinner than the IF wafer 216 shown in FIG. 2G as a result of such grinding.

Figure 3:
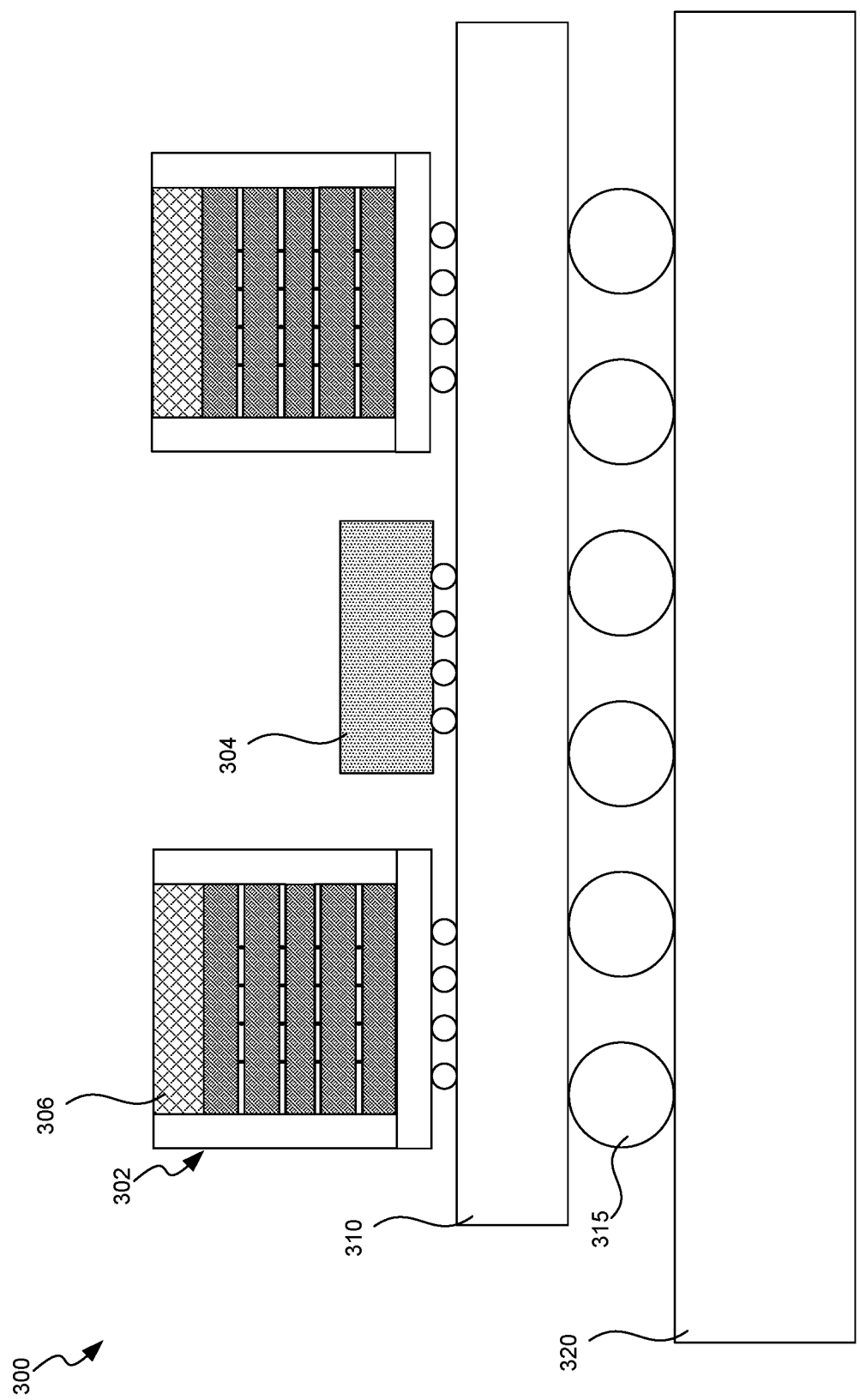
FIG. 3 is a cross-sectional view of a semiconductor device assembly including semiconductor devices plated with grindable metal heat sinks in accordance with embodiments of the present disclosure.

FIG. 3 is a cross-sectional view of a semiconductor device assembly 300 including semiconductor device packages 302 plated with grindable metal heat sinks 306 in accordance with embodiments of the present disclosure. The semiconductor device packages 302 can be similar to semiconductor device package 100 of FIG. 1 and singulated semiconductor device packages 210a-c of FIG. 2H. The semiconductor device packages 302 include a grindable metal heat sink 306 similar to the metal heat sink 112 and metal layers 206a-c of FIGS. 1 and 2H.

The semiconductor device assembly 300 can a memory device, such as a high bandwidth memory (HBM) device. For example, the semiconductor device packages 302 can comprise a stack of DRAM dies interconnected by TSVs and be mounted on a package substrate 310 adjacent to a processor die 304, such as a graphics processing unit (GPU) die. The semiconductor device packages 302 can be coupled to the processor die 304 through an interposer (not shown). The package substrate 310 can be mounted on a PCB 320 as part of a larger system, for example using electrical connectors 315. Note this is just one illustrative example and that semiconductor device packages including an embedded grindable heat sink can be used in a variety of devices or systems, as described with reference to FIG. 5 below.

Figure 4:
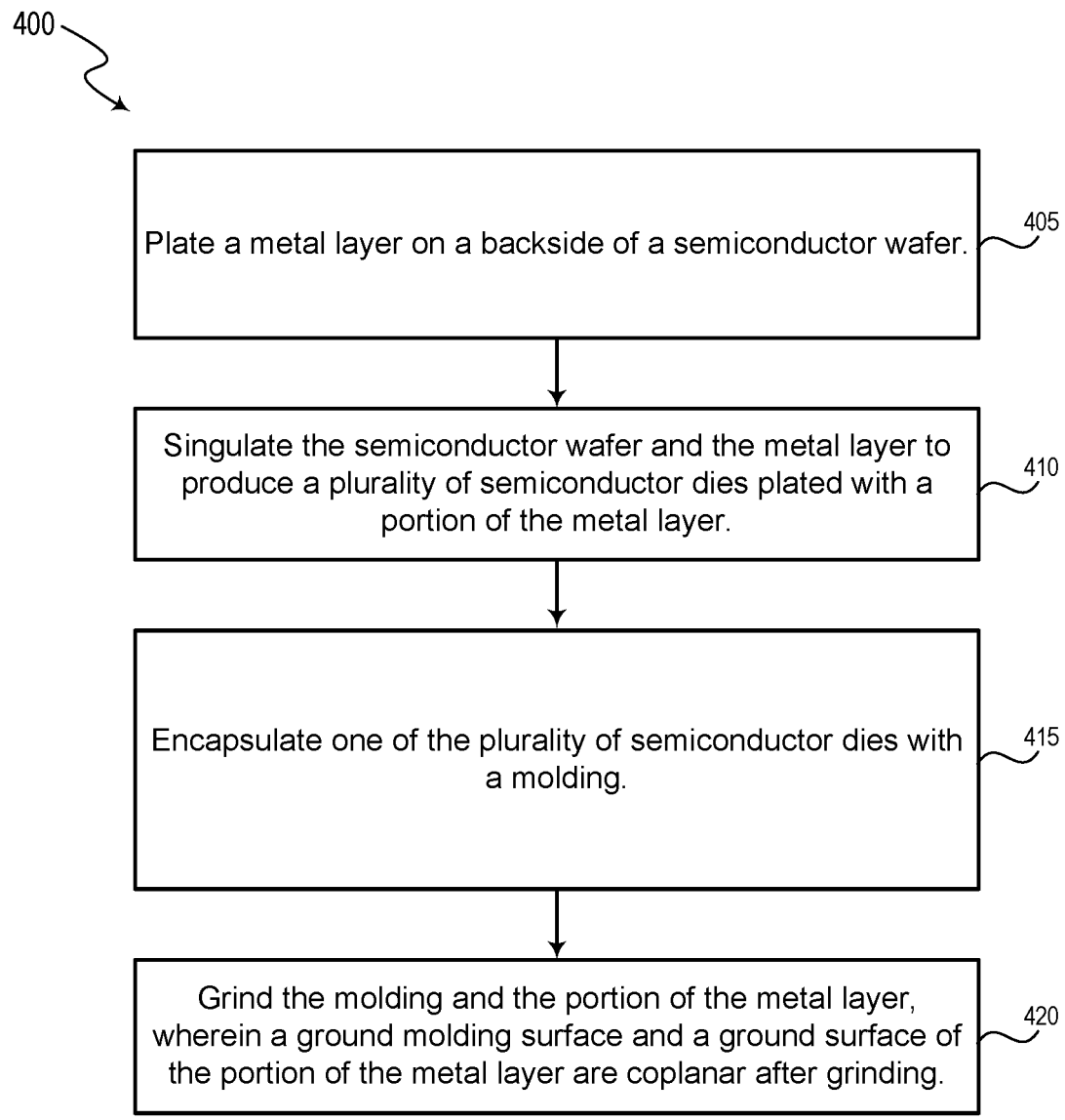
FIG. 4 is a flow chart illustrating a method of fabricating a semiconductor device package in accordance with embodiments of the present disclosure.

FIG. 4 is a flow chart illustrating a method 400 of fabricating a semiconductor device package in accordance with embodiments of the present disclosure. At 405, a metal layer is plated on a semiconductor wafer. For example, the metal layer can be similar to metal layer 206 of FIG. 2D. In some embodiments, the semiconductor wafer is passivated prior to plating. The plating of the metal layer can include depositing a seed layer, such as seed layer 204 of FIGS. 2C and 2D.

At 410, the semiconductor wafer and the metal layer plated at 405 is singulated to produce a semiconductor die of a plurality of semiconductor dies. The semiconductor die remains plated with a portion of the metal layer. For example, the semiconductor wafer and the metal layer can be singulated using a dicing saw or by another suitable dicing process. In some embodiments, the semiconductor die plated with the portion of the metal layer can then be mounted on a stack of semiconductor dies, such as by thermocompression bonding.

At 415, the semiconductor die from step 410 is encapsulated with a molding. For example, the molding can be similar to molding 140 of FIG. 1 and molding 220 of FIG. 2F-H. In some embodiments, the molding encapsulates a stack of semiconductor dies mounted on a wafer, such as IF wafer 216 of FIG. 2F.

At 420, the molding and the portion of the metal layer is ground. The grinding of the molding and the portion of the metal layer can be performed simultaneously, such as with a grinding wheel or disc. After the grinding at 420, a ground molding surface and a ground surface of the portion of the metal layer can be coplanar. In some embodiments, the metal layer can exhibit grinding marks consistent with abrasion from a grinding wheel.

Figure 5:
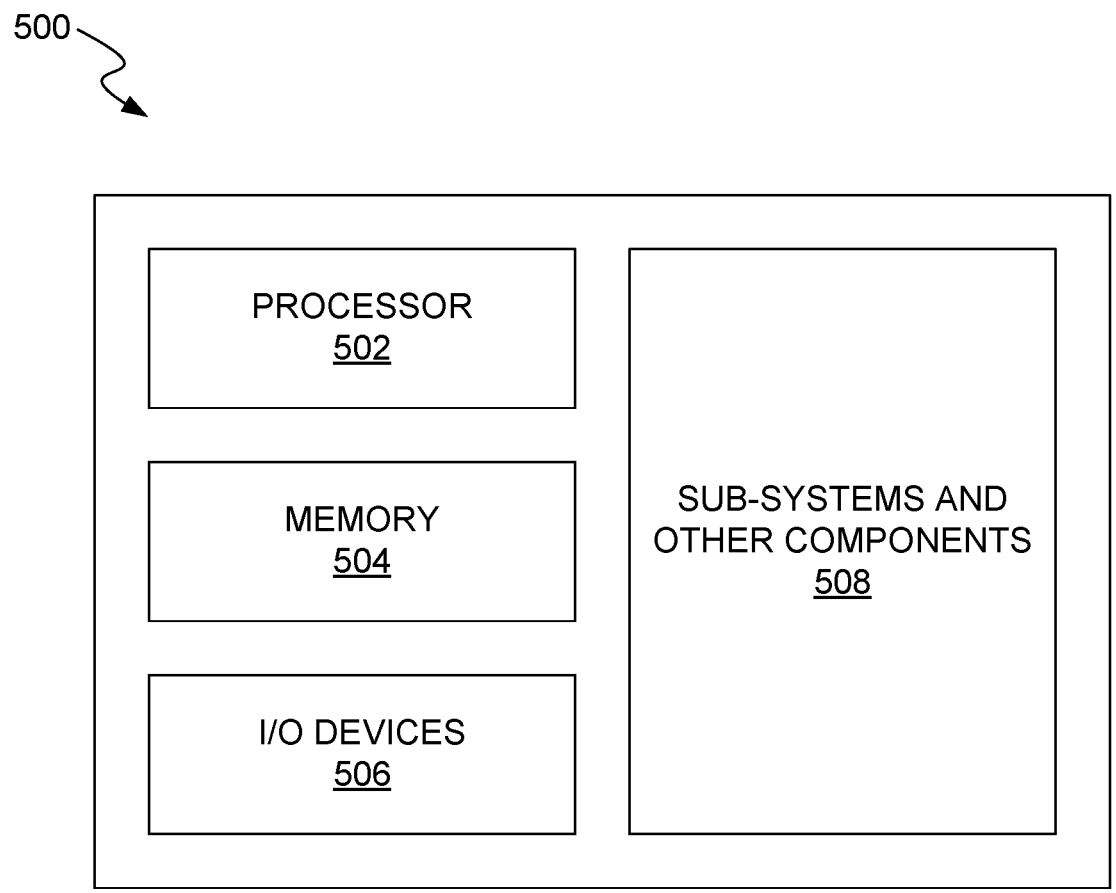
FIG. 5 is a schematic view of system that includes a semiconductor device in accordance with embodiments of the present disclosure.

FIG. 5 is a schematic view of a system 500 that includes a semiconductor device in accordance with embodiments of the present disclosure. Any one of the semiconductor devices and/or dies having the features described above with reference to FIGS. 1-4 can be incorporated into any of a myriad of larger and/or more complex systems, a representative example of which is system 500 shown schematically in FIG. 5. The system 500 can include a processor 502, a memory 505 (e.g., SRAM, DRAM, flash, and/or other memory devices), input/output devices 506, and/or other subsystems or components 508. The semiconductor dies and/or packages described above with reference to FIGS. 1-4 can be included in any of the elements shown in FIG. 5. The resulting system 500 can be configured to perform any of a wide variety of suitable computing, processing, storage, sensing, imaging, and/or other functions. Accordingly, representative examples of the system 500 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 500 include lights, cameras, vehicles, etc. With regard to these and other examples, the system 500 can be housed in a single unit or distributed over multiple interconnected units (e.g., through a communication network). The components of the system 500 can accordingly include local and/or remote memory storage devices and any of a wide variety of suitable computer-readable media.

From the foregoing, it will be appreciated that specific embodiments of the invention have been described herein for purposes of illustration, but that various modifications may be made without deviating from the scope of the invention. Accordingly, the invention is not limited except as by the appended claims.

What is claimed:

1. A semiconductor device package comprising:
   a semiconductor die stack including a top die and one or more core dies below the top die;
   a metal heat sink plated on a top surface of the top die and having a plurality of side surfaces coplanar with corresponding ones of a plurality of sidewalls of the semiconductor die stack; and
   a molding surrounding the semiconductor die stack and the metal heat sink, the molding including a top surface coplanar with an exposed upper surface of the metal heat sink,
   wherein the top surface of the molding and the exposed upper surface of the metal heat sink are both mechanically altered.

2. The semiconductor device package of claim 1, wherein the mechanically altered upper surface of the metal heat sink includes grinding marks.

3. The semiconductor device package of claim 1, wherein each of the plurality of side surfaces and each of the plurality of sidewalls are mechanically altered.

4. The semiconductor device package of claim 3, wherein the mechanically altered side surfaces of the metal heat sink include saw marks.

5. The semiconductor device package of claim 1, wherein the metal heat sink has a thickness between 100 μm and 200 μm.

6. The semiconductor device package of claim 1, further comprising:
   a seed layer between the top die and the metal heat sink.

7. The semiconductor device package of claim 1, wherein the metal heat sink is comprised of copper.

8. The semiconductor device package of claim 1, wherein the semiconductor die stack includes a die attach film between the top die and the one or more core dies.

9. The semiconductor device package of claim 1, wherein the top surface of the top die is passivated.

10. A method of fabricating a semiconductor device package comprising:
    plating a metal layer on a backside of a semiconductor wafer;
    singulating the semiconductor wafer and the metal layer to produce a plurality of semiconductor dies, each semiconductor die plated with a portion of the metal layer;
    forming a semiconductor die stack including a top die and one or more core dies below the top die,
       wherein the top die is one of the plurality of semiconductor dies,
       wherein the portion of the metal layer forms a metal heat sink plated on a top surface of the top die, the metal heat sink having a plurality of side surfaces coplanar with corresponding ones of a plurality of sidewalls of the semiconductor die stack;
    encapsulating one of the plurality of semiconductor dies with a molding; and
    grinding the molding and the portion of the metal layer,
       wherein a ground molding surface and a ground surface of the portion of the metal layer are coplanar after the grinding,
       wherein the molding surrounds the semiconductor die stack and the metal heat sink, the molding including a top surface coplanar with an exposed upper surface of the metal heat sink,
       wherein the top surface of the molding and the exposed upper surface of the metal heat sink are both mechanically altered.

11. The method of claim 10, further comprising:
mounting the semiconductor wafer on a carrier; and
after plating the metal layer, debonding the semiconductor wafer from the carrier.

12. The method of claim 10, wherein plating the metal layer comprises:
passivating the backside of the semiconductor wafer.

13. The method of claim 12, wherein the plating the metal layer further comprises:
depositing a seed layer on the passivated backside of the semiconductor wafer; and
plating the metal layer on the seed layer.

14. The method of claim 10, further comprising:
thinning the semiconductor wafer by chemical-mechanical planarization prior to plating the metal layer.

15. The method of claim 10, wherein forming the semiconductor die stack includes:
mounting the one of the plurality of semiconductor dies on a stack of core semiconductor dies prior to encapsulating the one of the plurality of semiconductor dies with a molding,
wherein the molding further encapsulates the stack of core semiconductor dies.

16. The method of claim 15, wherein the semiconductor die is mounted on the semiconductor die stack by thermocompression bonding.

17. The method of claim 10, wherein the one of the plurality of semiconductor dies is a first semiconductor die, the method further comprising:
encapsulating a second semiconductor die of the plurality of semiconductor dies with the molding, the second semiconductor die plated with a second portion of the metal layer; and
grinding the molding and the second portion of the metal layer,
wherein the first semiconductor die and the second semiconductor die are mounted on a same wafer, and
wherein the ground molding surface and the ground surface of the portion of the metal layer are coplanar with a second ground surface of the second portion of the metal layer after said grinding the molding and the second portion of the metal layer.

18. A semiconductor device assembly comprising:
a package substrate;
a processor die coupled to the package substrate;
a semiconductor die stack coupled to the package substrate and electrically connected to the processor die, the semiconductor die stack including:
a top die and a plurality of core dies below the top die;
a grindable metal heat sink plated to a top surface of the top die and having a plurality of side surfaces coplanar with corresponding ones of a plurality of sidewalls of the semiconductor die stack; and
a molding surrounding the semiconductor die stack and the grindable metal heat sink,
wherein an upper surface of the grindable metal heat sink is exposed from the molding and coplanar with an upper surface of the molding, and
wherein a top surface of the molding and the upper surface of the grindable metal heat sink are both mechanically altered.

19. The semiconductor device assembly of claim 18, wherein the processor die is a graphics processing unit (GPU) die, and wherein the core dies and the top die are memory dies.

20. The semiconductor device assembly of claim 18, wherein the upper surface of the grindable metal heat sink and the top surface of the molding exhibit grinding marks indicative of abrasion from a grinding wheel.

* * * * *